United States Patent [19]
Baran

[11] Patent Number: 4,954,929
[45] Date of Patent: Sep. 4, 1990

[54] MULTI-LAYER CIRCUIT BOARD THAT SUPPRESSES RADIO FREQUENCY INTERFERENCE FROM HIGH FREQUENCY SIGNALS

[75] Inventor: Jozef B. Baran, Moreno Valley, Calif.

[73] Assignee: AST Research, Inc., Irvine, Calif.

[21] Appl. No.: 396,956

[22] Filed: Aug. 22, 1989

[51] Int. Cl.$^5$ .............................................. H05K 9/00
[52] U.S. Cl. ..................................... 361/414; 29/831; 29/846; 174/35 R; 174/36; 361/406; 361/424
[58] Field of Search ............... 174/35 R, 36; 361/397, 361/400, 406, 409–410, 412, 414, 424; 29/831, 846

[56] References Cited

U.S. PATENT DOCUMENTS

| | | | |
|---|---|---|---|
| 3,398,232 | 8/1968 | Hoffman | 361/424 |
| 3,680,005 | 7/1972 | Jorgensen et al. | 361/424 |
| 4,498,122 | 2/1985 | Rainal | 174/36 |
| 4,689,442 | 8/1987 | Ozaki | 361/424 |
| 4,845,311 | 7/1989 | Schreiber et al. | 174/36 |

Primary Examiner—Gregory D. Thompson
Attorney, Agent, or Firm—Knobbe, Martens, Olson & Bear

[57] ABSTRACT

A multi-layer printed circuit board is constructed to suppress radio frequency interference (RFI) generated by high frequency clock and data signals therein. Suppression is achieved by positioning clock lines carrying the clock signal on a first voltage reference layer proximate to a second voltage reference layer. The two layers shield the clock signal from the signal lines on other layers. Noise may be further reduced by forming bridges in the second voltage reference layer proximate to the clock lines so that the bridges span the width of the clock line. Capacitors are also preferably utilized to further suppress radiated noise. The capacitors provide AC coupling between the first and second voltage reference layers so that a low impedance path is provided for high frequency noise generated by the clock signal. The second voltage reference layer thus operates as an effectively continuous shield between the bridges.

9 Claims, 11 Drawing Sheets

MULTI-LAYER CIRCUIT BOARD THAT SUPPRESSES RADIO FREQUENCY INTERFERENCE FROM HIGH FREQUENCY SIGNALS

BACKGROUND OF THE INVENTION

1. Field of the Invention

The present invention relates to digital electronic systems, and, in particular, to circuitry used in digital computers and the like. More particularly, the invention relates to the suppression of radiated electrical noise generated by high frequency signals of such systems.

2. Description of the Related Art

The circuitry of digital electronic systems is typically mounted on printed circuit boards. For example, in small business or personal computers, such circuit boards include a main system board (often referred to as a mother board) and a number of smaller circuit boards that are inserted into connectors on the mother board. Typically, such circuit boards are multi-layer circuit boards. That is, the connections to and the interconnections between integrated circuits and other components on the surface of a circuit board are provided by metallic traces on the surface layers of the circuit board as well as on additional traces on inner layers of the circuit board. In addition, exemplary multi-layer printed circuit boards include layers that are dedicated to a particular voltage reference. For example, the ground reference (i.e., zero volts) may be distributed on an inner layer of the circuit board. In addition, the primary supply voltage (e.g., +5 volts) may also be distributed on a separate dedicated layer of the circuit board. Interconnections between the layers of the circuit board are provided by feedthrough connections (often referred to as vias). In particular, connections between integrated circuits on one surface layer and circuit paths on the opposite surface layer are provided by vias. Similarly, the power and ground connections to the integrated circuits are provided by vias that are electrically connected to the respective voltage reference layers.

Digital electronic circuits generally operate in synchronism with one or more clock signals that are distributed to the integrated circuits on the printed circuit boards. For example, small business/personal computers, such as computers that utilize the Intel ® 80×86 family of microprocessors utilize a clock signal that is a multiple of the rated operating frequency of the microprocessor. As a specific example, a computer based upon an Intel ® 80386 microprocessor operating at 25 MHz utilizes a system clock signal having a frequency of 50 MHz. Such an operating frequency is close to the lower end of the television broadcast band which begins at 54 MHz. If the clock signal is permitted to radiate significant energy, it may interfere with the operation of television receivers and other radio frequency communications equipment. Such radio frequency interference (RFI) is not permitted by regulations promulgated by the Federal Communications Commission (FCC). Thus, it is necessary to suppress the radiation of electromagnetic noise from the clock signal and other signals operating at high frequencies in order to comply with FCC regulations.

One method of suppressing the radiation of electromagnetic energy from a digital computer is to shield the entire computer within a metallic enclosure. Such metallic enclosures serve the dual purpose of providing electromagnetic shielding as well as providing structural support for circuit boards, disk drives and other components within the computer. However, this method only suppresses direct radiation to the external environment of the computer and does not prevent radiation of such noise to other signal lines within the computer. Since it is generally necessary to provide signal lines to interconnect a computer to an external device, such as a printer or the like, the noise generated by a high frequency signal may be picked up on a signal line and thus radiated externally to the computer.

In systems where the high frequency clock signals are localized on particular cards or on particular portions of a single card, the high frequency clock circuitry on the cards or card portions can be shielded from other circuits using conventional shielding techniques such as surrounding the cards or the card portions with a metallic enclosure. Again, this is effective only if signal lines carrying the high frequency clock signals can be isolated from other signals that pass beyond the boundaries of the shielding enclosure. Furthermore, the mechanical shielding structures are generally bulky and add to the overall size of the computer system in which they are used.

Another method that has been utilized is to provide the shielding as part of the printed circuit board. For example, the high frequency clock lines can be positioned on an inner layer of a circuit board proximate to one or two voltage reference layers. The voltage reference layer or layers operate to shield the clock lines to suppress the radiation of electromagnetic energy. This technique provides significant improvement over the previously described techniques since the shielding is applied directly to the printed circuit boards having the high frequency clock lines. Although this technique provides substantial improvement in the suppression of emitted RFI from the clock lines, one skilled in the art will appreciate that an additional layer of the printed circuit board increases the cost of the circuit both in terms of material as well as engineering and manufacturing costs. In addition, the additional layer increases the thickness of the circuit board. The additional thickness may not be acceptable, particularly when the printed circuit board has an edge connector formed on it. Such an edge connector may be too large to insert into a conventional card edge connector used in typical computers. Thus, a need exists for a RFI suppression technique compatible with the existing standards for printed circuit boards.

SUMMARY OF THE INVENTION

The present invention is a multi-layer printed circuit board that is connectable to first and second voltage reference sources. The printed circuit board suppresses radio frequency interference generated by high frequency signals present in electronic circuitry on the printed circuit board. The printed circuit board comprises an interconnection layer which comprises electrically conductive material formed into a plurality of electrically conductive paths to interconnect the electronic circuitry on the circuit board.

The circuit board further comprises a first voltage reference layer connectable to the first voltage reference source. The first voltage reference layer is positioned in parallel with the layer of electrically conductive material. A second voltage reference layer is connectable to the second voltage reference source. The second voltage reference layer is positioned in parallel with the first voltage reference layer.

The printed circuit board of the present invention further includes means for selectively connecting the first voltage reference layer to the electronic circuitry and means for selectively connecting the second voltage reference layer to the electronic circuitry.

At least one signal line is formed on the first voltage reference layer and electrically isolated from the first voltage reference source. The signal line is shielded by the first voltage reference layer and the second voltage reference layer to suppress radio frequency interference between a signal on the signal line and signals on the interconnection paths on the interconnection layer.

Preferably, one of the first and second voltage references to which the corresponding voltage reference layer is connected is a supply voltage source and the other of the first and second voltage references is a ground reference.

Also preferably, the means for interconnecting the first voltage reference layer to the interconnection layer and the means for interconnecting the second voltage reference layer to the interconnection layer comprise feedthroughs that penetrate the first and second voltage reference layers and the interconnection layer.

Preferred embodiments of the printed circuit board of the present invention include a second interconnection layer parallel to the first interconnection layer. The first and second voltage reference layers are positioned between the first and second interconnection layers.

In particularly preferred embodiments of the invention, the circuit board further includes a plurality of interconnection lines formed in the second voltage reference layer and electrically isolated from the second voltage reference source. The interconnection lines in the second voltage reference layer span the signal line formed in the first voltage reference layer. The interconnection lines in the second voltage reference layer are electrically connected to the first voltage reference source. Preferably, the interconnection lines in the second voltage reference layer are electrically connected to the first voltage reference layer via feedthroughs that penetrate the first and second voltage reference layers.

The circuit board preferably includes a plurality of capacitors mounted on the circuit board. Each of the capacitors has first and second leads, with the first lead electrically connected to the first voltage reference source via the first voltage reference layer, and with the second lead connected to the second voltage reference source via the second voltage reference layer. In exemplary circuit boards according to this aspect of the invention, a first plurality of feedthroughs connect the first leads of the capacitors to the first voltage reference layer and a second plurality of feedthroughs connect the second leads of the capacitors to the second voltage reference layer. The first and second plurality of feedthroughs are positioned proximate to and electrically isolated from the signal line on the first voltage reference layer. The first and second plurality of feedthroughs provide additional radio frequency interference shielding of the signal line on the first voltage reference layer.

The present invention is ideally suited for high speed digital electronic circuits wherein the signal line on the first voltage reference layer is connectable to a high frequency signal source, and wherein the first and second voltage reference layers block the radiation of high frequency electrical energy from the signal line to interconnection paths on the first interconnection layer.

DETAILED DESCRIPTION OF THE PREFERRED EMBODIMENT

Brief Review of Structure of Multi-layer Printed Circuit Boards

Figure 1:
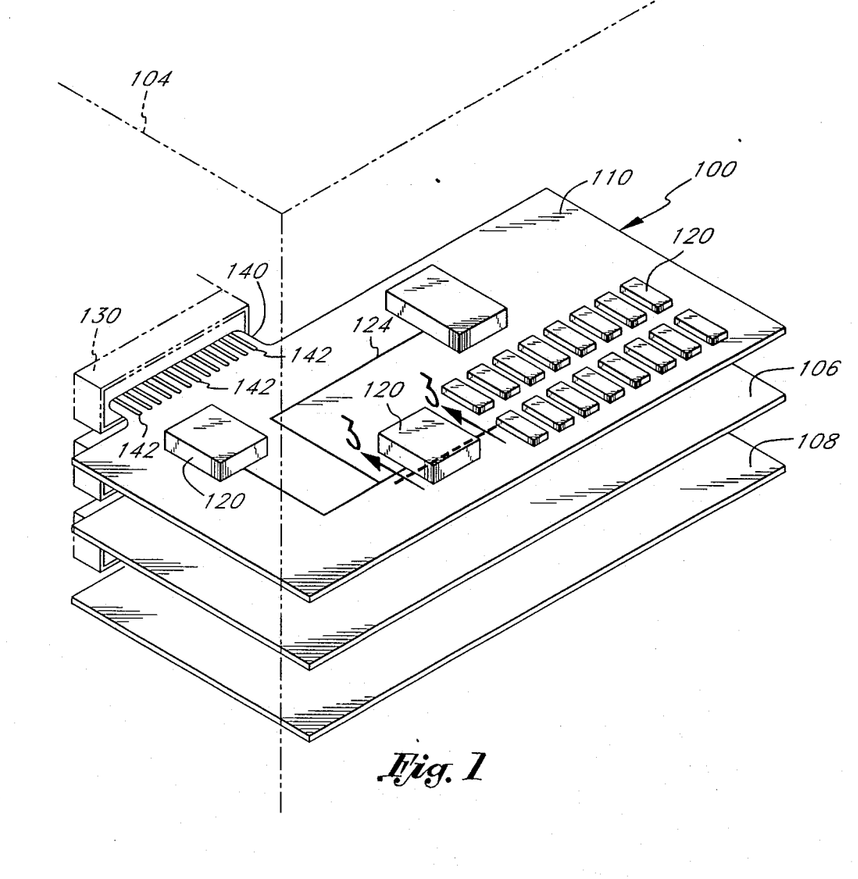
FIG. 1 is a perspective view of an exemplary multi-layer printed circuit board such as may be used in a computer system.

FIG. 1 illustrates an exemplary multi-layer printed circuit board 100 which may be used in a computer 104 (represented in part by a phantom outline). Additional printed circuit boards 106 and 108 are also shown. As illustrated, the circuit board 100 includes a component surface 110 onto which are mounted a plurality of electronic components, such as integrated circuits, transistors, resistors, capacitors, and the like. The components on the circuit board are shown pictorially and are designated in globo by the number 120. The components 120 are interconnected by a plurality of circuit paths 124 that are typically formed by etching a copper coating from the surface 110 during the manufacturing process. The copper remaining after the etching process provides the interconnection paths. Although only a few circuit paths 124 are shown in FIG. 1, it should be understood that the printed circuit board 100 includes hundreds of interconnection paths 124. It should be further understood that multi-layer printed circuit boards, such as the circuit board 100, further include interconnection paths on a second surface opposite the component surface 110. The second surface is not shown in FIG. 1. In many printed circuit boards, additional components may also be mounted on the second surface. In addition, interconnection paths may be provided on layers sandwiched between the two surface layers.

When the printed circuit board 100 is to be plugged into a mother board of the computer 104, or the like, it includes a connector. Although many different interconnection systems are available, one of the most common techniques is the use of card edge connectors which are mounted on the mother board (not shown). An exemplary conventional card edge connector 130 is illustrated in phantom in FIG. 1. The card edge connector 130 includes a plurality of contacts (not shown) which provide interconnections for voltages and signals provided to and generated by the printed circuit board components 120. As illustrated, the printed circuit board 100 includes an edge portion 140 which has a plurality of regularly spaced metallic fingers 142 that are formed perpendicular to the edge of the board 100. The fingers 142 engage the contacts of the card edge connector 130 when the circuit board 100 is inserted into the computer 104. The fingers 142 are formed by the etching process that forms the interconnection paths 124, discussed above. The fingers 142 are connected to the components 120 via the interconnection paths 124.

Figure 2:
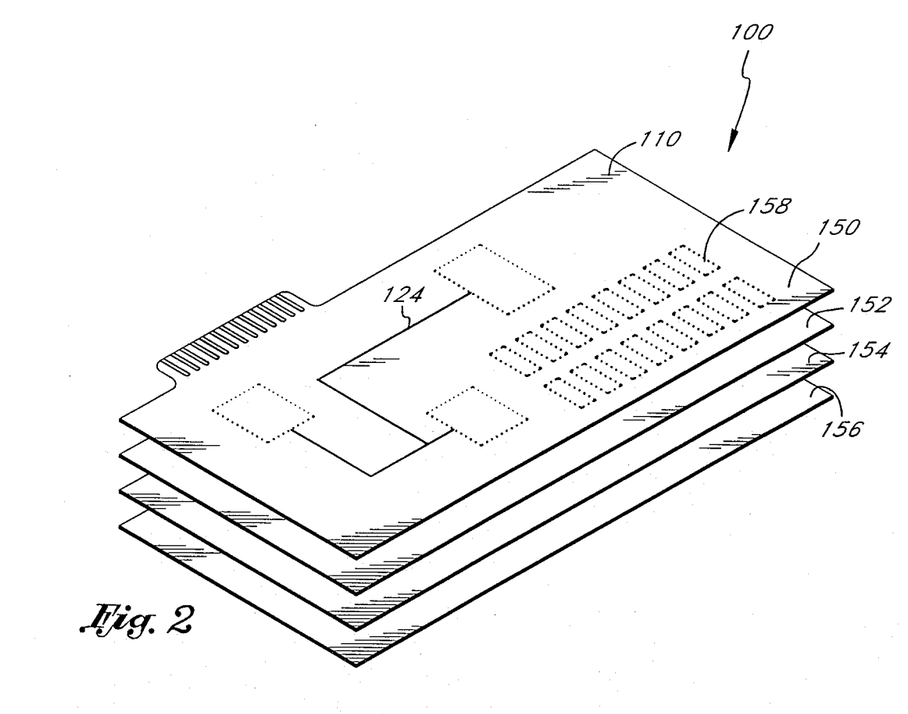
FIG. 2 is an exploded view of the multi-layer printed circuit board of FIGS. 1 and 2 showing two interconnecting layers, a ground reference layer and a supply voltage layer.

FIG. 2 is an exploded view of the printed circuit board 100 showing four layers 150, 152, 154 and 156. As is known in the art, each of the layers comprises an insulating substrate, such as phenolic, onto which is bonded a metallic layer, such as copper. As discussed above, portions of the copper layer are etched away from each of the layers to selectively expose the phenolic substrate. The copper remaining after the etching process forms the interconnection paths for the respective layers. It should be understood that each of the layers is etched separately and then bonded together to form the composite multi-layer board illustrated in FIG. 1.

As illustrated in FIG. 2, the first layer 150 supports the component surface 110 which includes the interconnection paths 124. The component surface 110 also includes a plurality of mounting pads 158 onto which the components 120 (FIG. 1) are mounted by soldering or other conventional methods. Similarly, the fourth layer 156 is formed in a similar manner to provide interconnection paths. The interconnection paths are typically on the lower surface of the fourth layer 156 and are not shown in FIG. 2.

The second layer 152 and the third layer 154 in FIG. 2 are voltage reference layers. For example, the second layer 152 is advantageously a ground (zero volts) reference and the third layer 154 is advantageously a power supply voltage layer (e.g., +5 volts). In typical known printed circuit boards, the ground layer 152 and the supply voltage layer 154 have substantial areas of copper remaining after the etching process to provide fairly uniform distribution of the respective power and ground voltages within the printed circuit board 100. Basically, the power layer 154 and the ground layer 152 have copper removed only in areas where feedthrough connections are formed through the printed circuit board 100 and the feedthrough connections are to be electrically isolated from the respective voltage reference.

Figure 3:
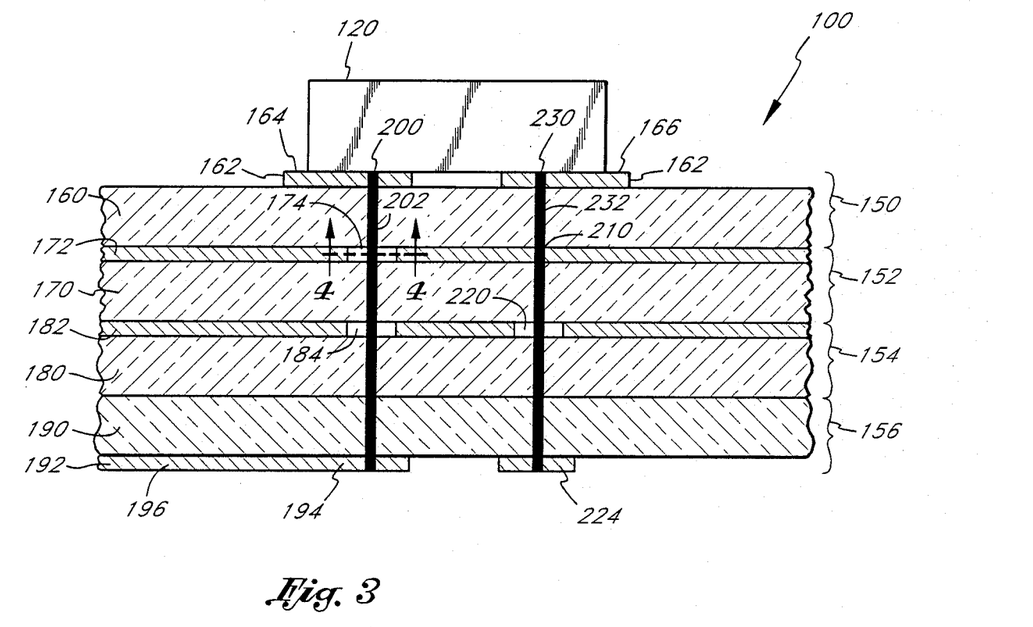
FIG. 3 is a cross-sectional view of the multi-layer printed circuit board of FIGS. 1 and 2 taken along the lines 3—3 in FIG. 1 showing details of the construction of feedthroughs or vias.
Figure 4:
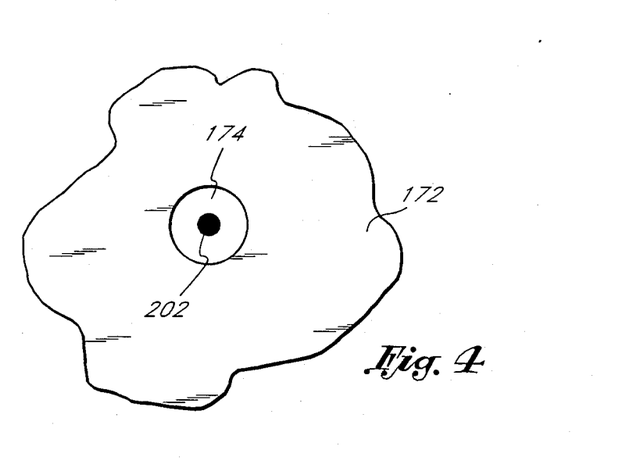
FIG. 4 is an enlarged plan view of a feedthrough of FIG. 3 taken along the lines 4—4 in FIG. 3.

The foregoing is illustrated in FIG. 3 by an exemplary cross-sectional view of the completed printed circuit board 100 which shows additional details of the construction of each of the layers. As illustrated, the first layer 150 comprises a layer 160 of phenolic, or the like, and a thin layer 162 of copper. The copper layer 162 is etched to form a first interconnection pad 164 and a second interconnection pad 166 to which respective leads of an integrated circuit 120 are soldered. The second (i.e., ground reference) layer 152 comprises a layer 170 of phenolic and a thin layer 172 of copper. A portion of the copper layer 172 is removed to expose an area 174 of the phenolic layer 170. (The phenolic-only area 174 is advantageously round and is shown more clearly in FIG. 4.) The phenolic-only area 174 is positioned in alignment with the first interconnection pad 164 as shown. Similarly, the third (i.e., supply voltage) layer 154 comprises a layer 180 of phenolic and a thin layer 182 of copper. A portion of the copper layer 182 is removed to expose a circular area 184 of the phenolic layer 180. The phenolic-only area 184 is also positioned in alignment with the first interconnection pad 164 as shown. Finally, the fourth layer 156 comprises a layer 190 of phenolic and a thin layer 192 of copper. A third interconnection pad 194 is formed from the copper remaining after etching the fourth layer 156. As illustrated, the third interconnection pad 194 is aligned with the first interconnection pad 164 and with the phenolic-only areas 174 and 184. The third interconnection pad 194 is advantageously the terminus of an interconnection path 196, as illustrated. The interconnection path 196 may, for example, electrically interconnect the pad 194 with another pad (not shown) which is connected via a feedthrough (not shown) to another integrated circuit (not shown).

The first interconnection pad 164 and the third interconnection pad 194 are electrically interconnected by a feedthrough (or via) 200 which is formed in a conventional manner by drilling a hole 202 through the composite circuit board 100 through the first interconnection pad 164, the phenolic-only area 174, the phenolic-only area 184 and the third interconnection pad 194. Thereafter, the hole 202 is plated with copper, tin lead, or another suitable conductive material, to provide a continuous conductive path between the first interconnection pad 164 and the third interconnection pad 194.

The second interconnection pad 166 is connected to the ground layer 152 in a manner similar to the previously described connection. However, no phenolic-only area is formed in the copper layer 172. Rather, the portion of the copper layer 172 aligned with the second interconnection pad 166 remains intact at a location 210. A phenolic-only area 220 is formed in the copper layer 182 of the supply voltage layer 154, as described above. Similarly, a pad 224 is formed in the copper layer 192 of the fourth layer 156. Again, a feedthrough or via 230 is formed by drilling a hole 232 through the second interconnection pad 166, the location 210, the phenolic-only area 220 and the pad 224. The hole 232 is plated to provide an electrical path between the second interconnection pad 166 and the pad 224. It can be seen that the feedthrough 230 thus formed is electrically connected to the ground reference layer 152, as desired.

Description of the Improvement of the Present Invention

As discussed above in the background of the invention, additional circuit board layers can be provided. For example, an additional interconnection layer (not shown) can be provided between the ground layer 152 and the power layer 154. If the high frequency clock lines are formed on this additional layer, they can be effectively isolated from the other interconnection layers by the shielding effect of the power and ground layers 154, 152. However, as set forth above, the additional layer adds to the size (e.g., thickness) and cost of the printed circuit board. The present invention provides substantial suppression of the generated radio frequency noise without requiring an additional layer.

Figure 5:
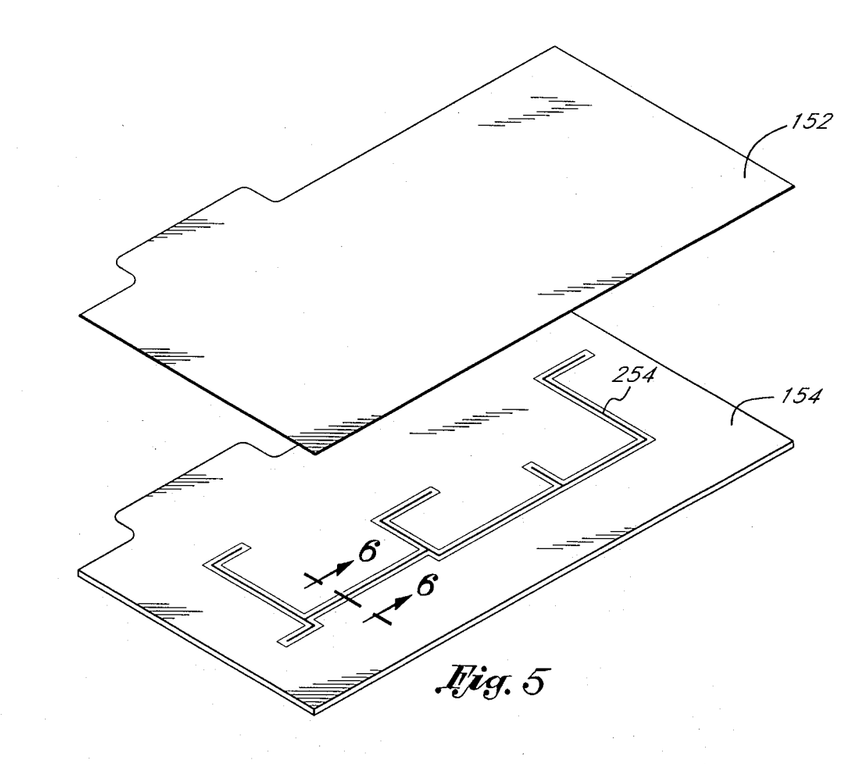
FIG. 5 illustrates an exploded view of the ground reference layer and supply voltage layer of FIG. 3 with a clock line formed in the supply voltage layer in accordance with one aspect of the present invention.

FIG. 5 illustrates the ground layer 152 and the supply voltage layer 154 in accordance with the present invention. As illustrated, the ground layer 152 and the supply voltage layer 154 have a substantial amount of the respective copper layers 172, 182 remaining as in the prior art. (For simplicity, the phenolic-only clearance holes for feedthroughs are not shown in FIG. 5.) However, unlike the prior art printed circuit boards, the copper layer 182 of the supply voltage layer 154 includes etched portions 250 that defines a plurality of clock lines 254. The clock lines 254 are all interconnected in FIG. 5; however, it should be understood that additional clock lines can be provided as needed. The etched portions 250 electrically isolate the clock lines 254 from the remaining portions of the copper layer 182 of the power layer 154 so that a high frequency clock signal can be applied to the clock lines 254 without shorting to the supply voltage reference applied to the supply voltage layer 154.

Figure 6:
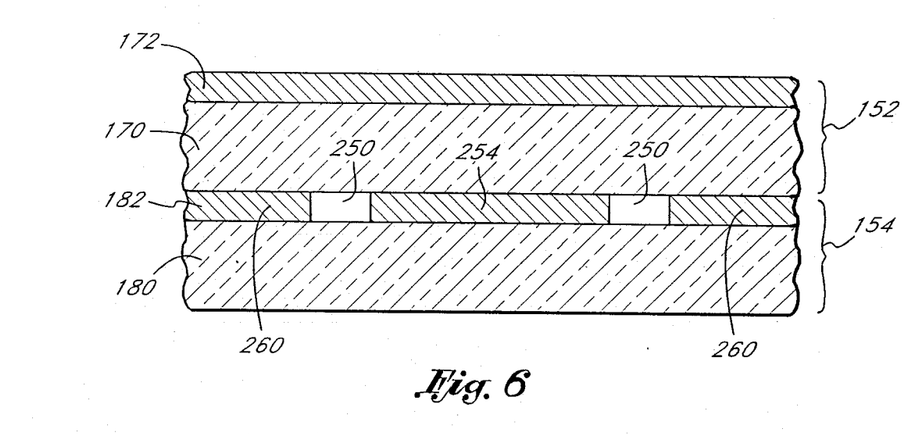
FIG. 6 is a cross-sectional view of the clock line, the supply voltage layer and the round reference layer taken along the lines 6—6 in FIG. 5.

FIG. 6 is a cross-sectional view of the clock line 254, the supply voltage layer 154 and the ground reference layer 152. The portions of the copper layer 182 of the power layer 154 that are connected to the voltage reference (e.g. +5 volts) are designated by the designator 260. It can be seen that the clock line 254 is surrounded on both sides by the voltage reference portions 260 and is positioned beneath the copper layer 182 of the ground layer 152. Thus, any radio frequency noise radiated from the clock line 254 is contained by either the adjacent voltage reference layer portions 260 or the ground reference layer 172. Thus, the advantages of shielding the clock lines on a separate layer are provided without the disadvantages of a separate layer for the clock lines.

Figure 7:
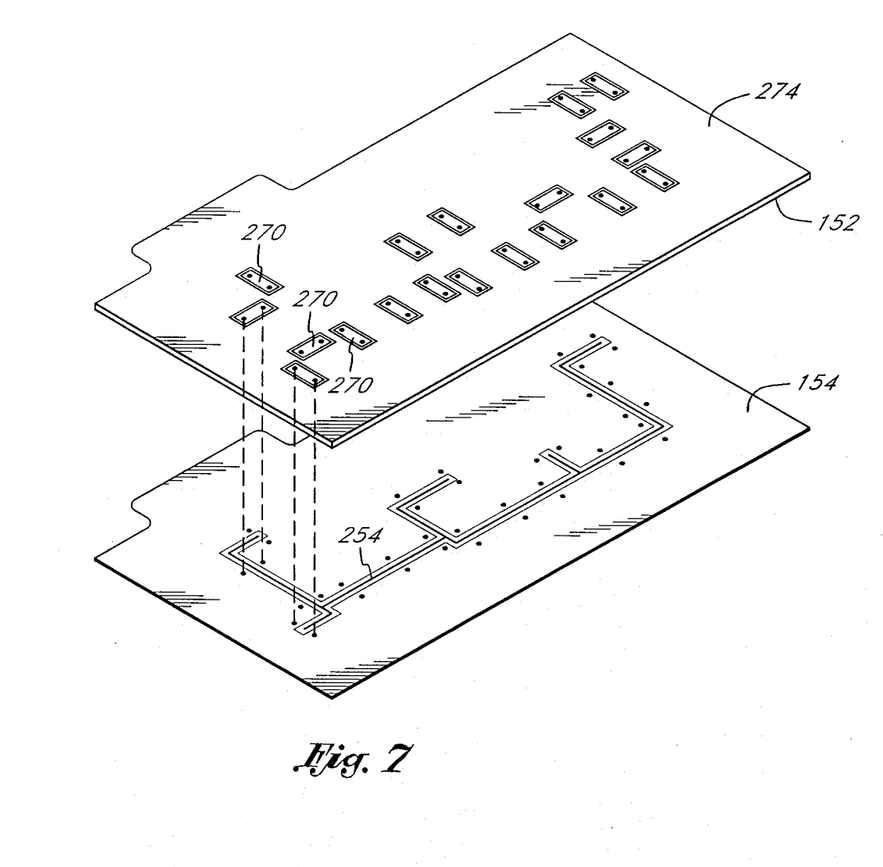
FIG. 7 illustrates an exploded perspective view of the supply voltage layer and the ground reference layer of FIG. 5, further showing the supply voltage bridge formed in the ground reference layer to electrically interconnect the supply voltage across the clock lines.

In FIGS. 5 and 6, the shielding is provided by two layers having different voltage potentials. It is preferable that the shielding be at a single voltage potential. FIG. 7 illustrates a further improvement in the embodiment of FIGS. 5 and 6 in which the effect of a shield at a single voltage potential is provided. As illustrated in FIG. 7, a plurality of conductive bridges 270 are formed in the copper layer 172 of the ground reference layer 152 by removing portions of the copper layer 172 to isolate the bridges 270 from the remaining portions of the copper layer 172. The remaining portions of the copper layer 172 are connected to the ground reference (e.g. 0 volts) as before and are designated by the designator 274. Each end of each of the bridges 270 is connected to the copper layer 182 of the supply voltage layer 154 via a pair of feedthroughs (not shown in FIG. 7) so that the bridges 270 are at the voltage potential (e.g., +5 volts) of the supply voltage layer 154.

Figure 8:
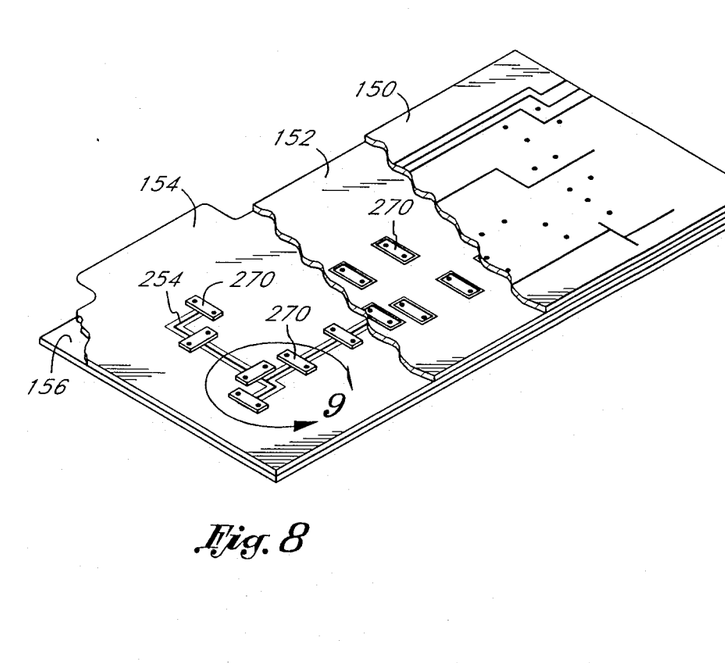
FIG. 8 is a completed multi-layer printed circuit board in which the first layer and the ground reference portion of the copper have been partially removed to show the spatial relationship between the bridges and the clock lines.

When the ground reference layer 152 and the supply voltage layer 154 are positioned proximate to each other in the completed circuit board 100, as shown in FIG. 8, each of the bridges 270 spans the clock lines 254. In FIG. 8, the first layer 150 and the ground reference portions 274 of the copper layer 172 have been partially removed to show the spatial relationship between the bridges 270 and the clock lines 254. An enlarged portion of FIG. 8 is illustrated in FIG. 9 to more clearly show the spatial relationship of the bridges 270 to the clock lines 254.

Figure 9:
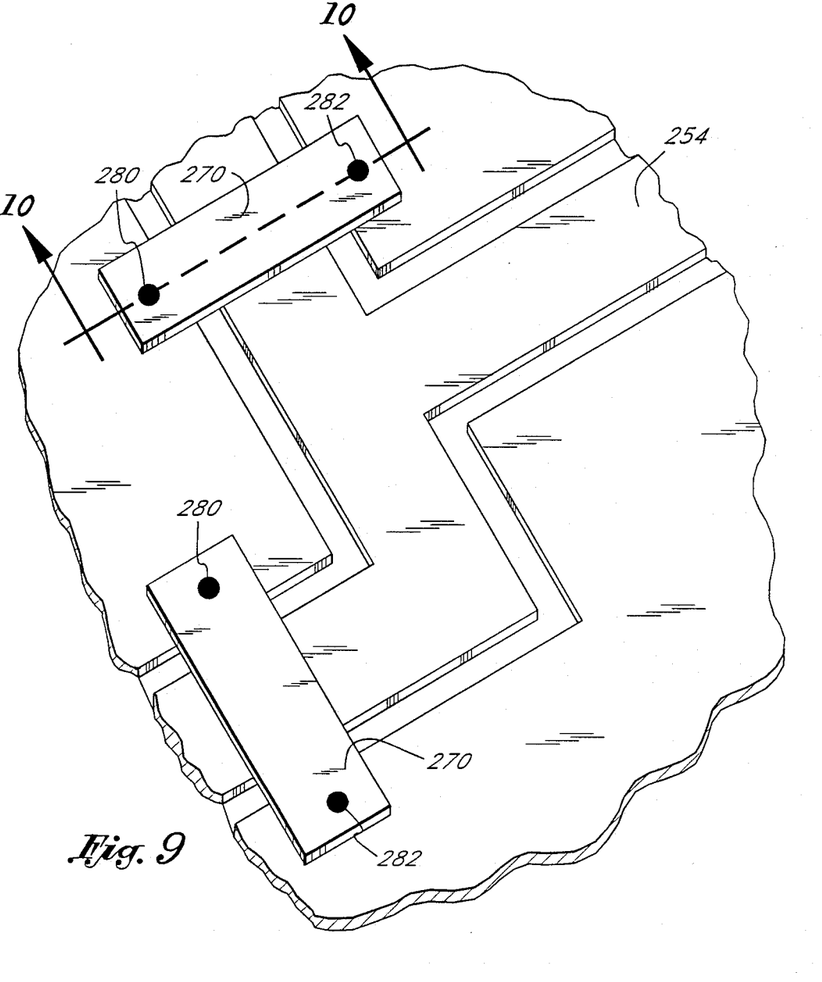
FIG. 9 is an enlarged illustration of the area 9 of FIG. 8 which more clearly shows the spatial relationship between the bridges and the clock lines.
Figure 10:
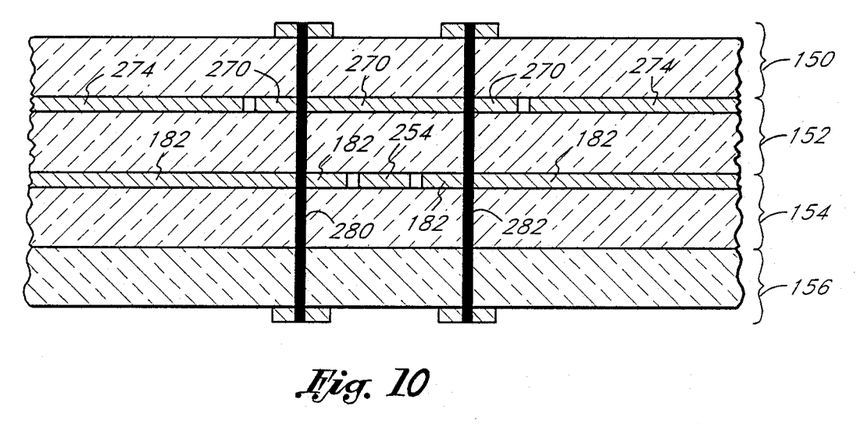
FIG. 10 is a cross-sectional view of an exemplary bridge taken along the lines 10—10 in FIG. 9 and also showing the first, second, third and fourth layers for clarity.
Figure 11:
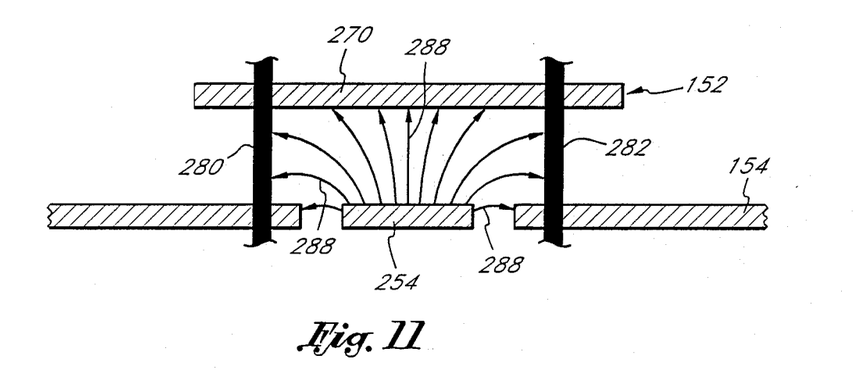
FIG. 11 illustrates the shielding effect provided by the present invention wherein the electromagnetic fields generated by the high frequency clock signal on the clock line are constrained by the surrounding copper of the supply voltage and ground reference layer.

FIG. 10 is a cross-sectional view taken through one of the bridges 270 in FIG. 9. The view in FIG. 10 includes the portions of the first, second, third and fourth layers 150, 152, 154, 156 for clarity. It can be seen in FIG. 10 that a first feedthrough 280 connects one end of the bridge 270 to the copper layer 182 of the power layer 154 and a second feedthrough 282 connects the other end of the bridge 270 to the copper layer 182. Thus, as further illustrated in FIG. 10, at each bridge 270, the clock line 254 has the same voltage potential (e.g., +5 volts) above it as it has on both sides. The feedthroughs 280, 282 provide additional shielding to the side of the clock line 254. The shielding effect is illustrated pictorially in FIG. 11 wherein the electromagnetic field generated by the high frequency clock signal on the clock line 254 (represented by a plurality of arrows 288) are shown constrained by the voltage potential on the adjacent portions of the supply voltage layer 154, the feedthroughs 280, 282, and the bridge 270, thus effectively suppressing the radiation of the electromagnetic energy.

Since the bridges 270 are spaced apart from each other by a short distance (e.g., approximately one-half inch to one inch in the preferred embodiments), the bridges would appear to not provide a continuous shield at the voltage reference potential. However, one skilled in the art will appreciate that at the frequencies involved (i.e., 50 to 100 MHz), the bridges have substantially the same effect as a continuous strip line waveguide. Thus, it is not necessary to provide a continuous voltage reference portion in the ground reference layer 152.

Although it is conceivable that the bridges 270 may be positioned in a manner so that no gaps exist between adjacent bridges 270 along the clock lines 254, this is not always practical. The bridges have the effect of breaking up the ground reference layer 152. In addition, each bridge 270 requires a pair of feedthroughs 280, 282 to interconnect them with the voltage reference layer 154. If rows of feedthroughs 280, 282 are provided along the full lengths of the clock line 254, significant areas of space on the printed circuit board 100 would be unavailable for other use. This problem would not only be experienced on the ground reference layer 152 and the supply voltage layer 154, but also by the first and fourth layers 150, 156 since the feedthroughs 280, 282 also penetrate those layers.

Although the present invention describes bridges formed in the ground reference layer 152 to shield the clock lines 254 lying on the supply voltage layer 154, one skilled in the art will appreciate that this invention could be applied as well to a bridges formed in the supply voltage layer 154 to shield clock lines 254 lying on the ground reference layer 152. As a further alternative, a portion of the clock lines 254 can be formed in the supply voltage layer 154 and a second portion of the clock lines can be formed in the ground reference layer 152 with the shielding provided by the other reference layer each case.

Figure 12:
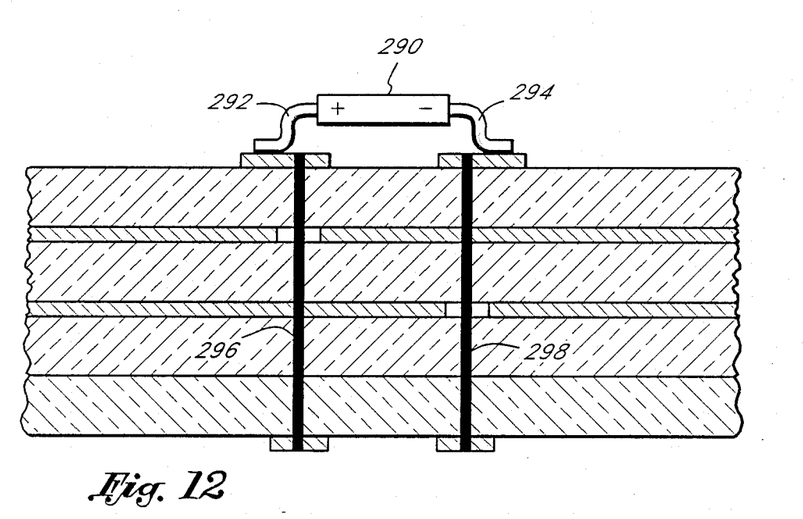
FIG. 12 illustrates the addition of capacitors which are connected to a power layer and ground layer.

A further improvement in the operation of the present invention is illustrated in FIG. 12. As discussed above the portions of the ground reference layer 152 between the bridges 270 provide additional shielding; however, these portions are not at the same voltage potential as the bridges 270. In order to connect the spaced apart bridges 270 (FIG. 8) to provide the effect of a continuous waveguide over the clock lines 254, a plurality of 0.01 microfarad capacitors 290 are mounted on the top surface 110 of the printed circuit board 100. As illustrated in FIG. 12, the leads 292 and 294 of each capacitor 290 are connected to the ground reference layer 152 and the supply voltage layer 154 via a pair of feedthroughs 296 and 298. Preferably, the capacitors 290 are located so that the feedthroughs 296 and 298 penetrate the supply voltage layer 154 and the ground reference layer 152 proximate to the clock line 254. The feedthrough 296 and the corresponding capacitor lead 292, are electrically isolated from the ground layer 152 and are electrically connected to the supply voltage layer 154. Conversely, the feedthrough 298 and the corresponding capacitor lead 294 are electrically connected to the ground reference layer 152 and are electrically isolated from the supply voltage layer 154. The feedthroughs 296 and 298 along the clock line 254 provide additional vertical shielding between the feedthroughs connecting the bridges 270. As one skilled in the art will understand, the effect of the capacitors 290 in the frequency range of 10-100 MHz is to provide a low impedance path between the supply voltage layer 154 and the ground reference layer 152, thus forming an effectively continuous shield over the clock lines 254.

Figure 13:
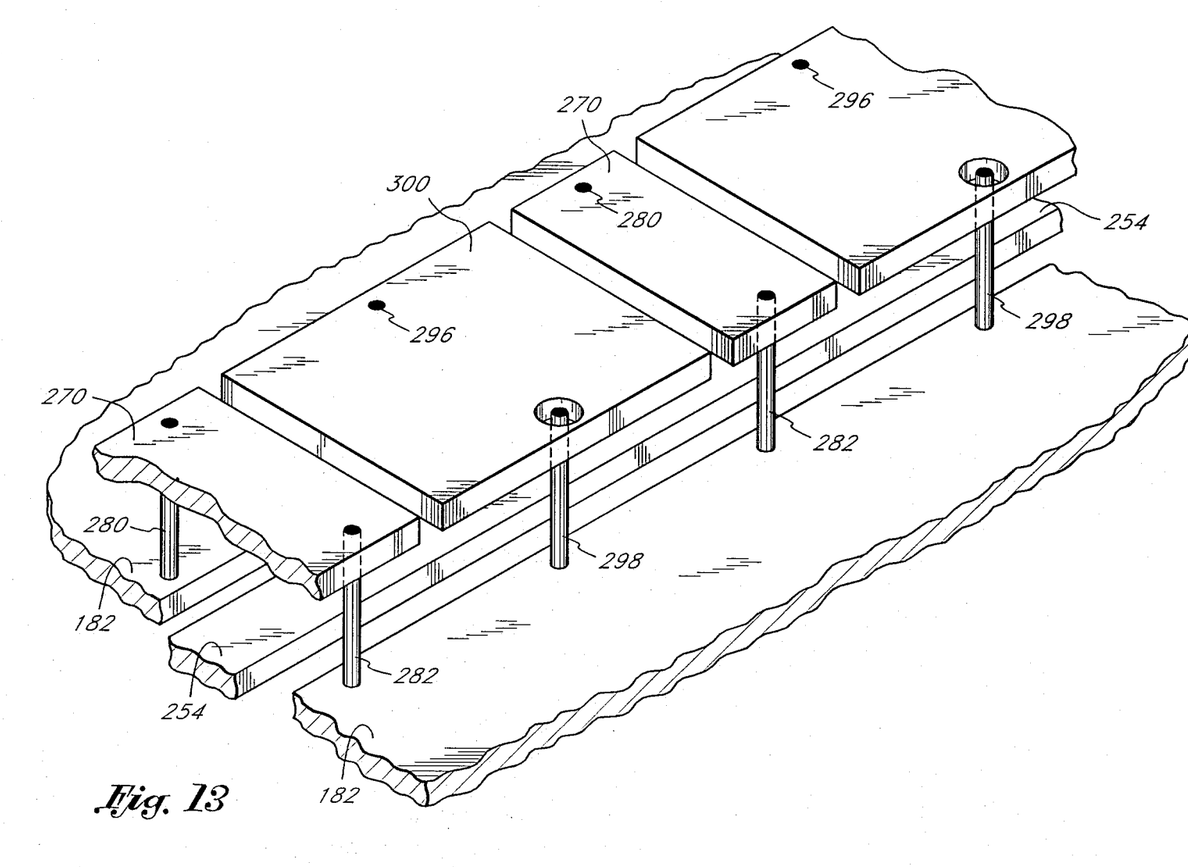
FIG. 13 is a pictorial illustration of the waveguide formed around the clock line in accordance with the present invention.

The overall effect of the present invention is pictorially illustrated in FIG. 13 which represents a waveguide 300 formed around the clock line 254. As illustrated the waveguide 300 comprises the adjacent portions of the copper layer 182 of the supply voltage layer 154; the bridges 270; the feedthroughs 280, 282 connecting the bridges 270 to the copper layer 182; the portions of the copper layer 172 of the ground layer 152 between the bridges 270; and the feedthroughs 296 and 298 that connect the capacitors 290 (not shown) to the ground reference layer 152 and the supply voltage layer 154, respectively.

What is claimed is:

1. A multi-layer printed circuit board connectable to first and second voltage reference sources, said printed circuit board suppressing radio frequency interference generated by high frequency signals present in electronic circuitry on said printed circuit board, said printed circuit board comprising:
a first interconnection layer comprising electrically conductive material formed into a plurality of electrically conductive paths to interconnect said electronic circuitry on said circuit board;
a first voltage reference layer connectable to the first voltage reference source, said first voltage reference layer positioned in parallel with said layer of electrically conductive material;
a second voltage reference layer connectable to the second voltage reference source, said second voltage reference layer positioned in parallel with said first voltage reference layer;
means for selectively connecting said first voltage reference layer to said electronic circuitry;
means for selectively connecting said second voltage reference layer to said electronic circuitry; and
at least one signal line formed on said first voltage reference layer, said signal line electrically isolated from the first voltage reference source, said signal line surrounded on both sides by portions of said first voltage reference layer connected to the first voltage reference source, said signal line shielded by said first voltage reference layer and said second voltage reference layer to suppress radio frequency interference between a signal on said signal line and signals on said conductive paths on said first interconnection layer.

2. The circuit board as defined in claim 1, further including a plurality of electrically conductive bridges formed in said second voltage reference layer and electrically isolated from the second voltage reference source, said conductive bridges in said second voltage reference layer spanning said signal line formed in said first voltage reference layer, said conductive bridges in said second voltage reference layer electrically connected to the first voltage reference source.

3. The circuit board as defined in claim 2, wherein said conductive bridges in said second voltage reference layer are electrically connected to said first voltage reference layer via feedthroughs that penetrate said first and second voltage reference layers.

4. The circuit board as defined in claim 2, further including a plurality of capacitors mounted on said circuit board, each of said capacitors having first and second leads, said first lead of each said capacitor electrically connected to the first voltage reference source via said first voltage reference layer, said second lead of each said capacitor connected to the second voltage reference source via said second voltage reference layer.

5. The circuit board as defined in claim 4, wherein said first leads of said capacitors are connected to said first voltage reference layer by a first plurality of feedthroughs and wherein said second leads of said capacitors are connected to said second voltage reference layer by a second plurality of feedthroughs, said first and second plurality of feedthroughs positioned proximate to and electrically isolated from said signal line on said first voltage reference layer, said first and second plurality of feedthroughs providing additional radio frequency interference shielding of said signal line on said first voltage reference layer.

6. The circuit board as defined in claim 1, wherein said means for interconnecting said first voltage reference layer to said electronic circuitry and said means for interconnecting said second voltage reference layer to said electronic circuitry comprise feedthroughs that penetrate said first and second voltage reference layers and said first interconnection layer.

7. The circuit board as defined in claim 1, further including a second interconnection layer parallel to said first interconnection layer, said first and second voltage reference layers positioned between said first and second interconnection layers.

8. The circuit board as defined in claim 1, wherein said signal line on said first voltage reference layer is connectable to a high frequency signal source, and wherein said first and second voltage reference layers block the radiation of high frequency electrical energy from said signal line to said conductive paths on said first interconnection layer.

9. A method of suppressing radio frequency noise in a printed circuit board having a high frequency signal operating thereon, said printed circuit board being connectable to first and second voltage sources, the method comprising the steps of:

providing first and second voltage reference layers connectable to the first and second voltage sources, respectively;

forming an electrical signal path in said first voltage reference layer that is electrically isolated from the rest of said first voltage reference layer; and forming a plurality of bridges in said second voltage reference layer that are electrically connected to said first voltage reference layer, each of said bridges spanning said electrical signal path in said first voltage reference layer.

* * * * *